(12) United States Patent
Wada et al.

(10) Patent No.: US 8,952,393 B2
(45) Date of Patent: Feb. 10, 2015

(54) SILICON CARBIDE SEMICONDUCTOR DEVICE

(71) Applicant: Sumitomo Electric Industries, Ltd., Osaka (JP)

(72) Inventors: Keiji Wada, Osaka (JP); Takeyoshi Masuda, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/176,966

(22) Filed: Feb. 10, 2014

(65) Prior Publication Data
US 2014/0252374 A1    Sep. 11, 2014

Related U.S. Application Data

(60) Provisional application No. 61/776,432, filed on Mar. 11, 2013.

(30) Foreign Application Priority Data

Mar. 11, 2013  (JP) ................................ 2013-047790

(51) Int. Cl.
*H01L 29/15* (2006.01)
*H01L 29/16* (2006.01)
*H01L 29/78* (2006.01)

(52) U.S. Cl.
CPC ............ *H01L 29/1608* (2013.01); *H01L 29/78* (2013.01)
USPC ............. 257/77; 257/328; 257/329; 257/339; 257/490; 257/495; 257/E29.104

(58) Field of Classification Search
USPC .................. 257/77, 328, 329, 339, 490, 495, 257/E29.104
See application file for complete search history.

(56) References Cited

U.S. PATENT DOCUMENTS

| 5,895,939 | A  | 4/1999 | Ueno |
|---|---|---|---|
| 6,037,632 | A  | 3/2000 | Omura et al. |
| 2008/0001159 | A1 | 1/2008 | Ota et al. |
| 2009/0200559 | A1 | 8/2009 | Suzuki et al. |

FOREIGN PATENT DOCUMENTS

| JP | 09-36359 A | 2/1997 |
|---|---|---|
| JP | 09-191109 A | 7/1997 |
| JP | 2001-274395 A | 10/2001 |
| JP | 2001-523895 A | 11/2001 |
| JP | 2008-016461 A | 1/2008 |
| JP | 2009-1494065 A | 8/2009 |
| WO | WO-99/26296 A2 | 5/1999 |

OTHER PUBLICATIONS

International Search Report and Written Opinion in PCT International Application No. PCT/JP2014/051468, dated Apr. 15, 2014.

*Primary Examiner* — Tan N Tran
(74) *Attorney, Agent, or Firm* — Venable LLP; Michael A. Sartori; Tamatane J. Aga

(57) ABSTRACT

A first drift layer has a first surface facing a first electrode and electrically connected to a first electrode, and a second surface opposite to the first surface. The first drift layer has an impurity concentration $N_A$. A relaxation region is provided in a portion of the second surface of the first drift layer. The first drift layer and the second drift layer form a drift region in which the relaxation region is buried. The second drift layer has an impurity concentration $N_B$, $N_B > N_A$ being satisfied. A body region, a source region, and a second electrode are provided on the second drift layer.

9 Claims, 13 Drawing Sheets

SILICON CARBIDE SEMICONDUCTOR DEVICE

BACKGROUND OF THE INVENTION

1. Field of the Invention

The present invention relates to a silicon carbide semiconductor device, in particular, a silicon carbide semiconductor device having a drift region.

2. Description of the Background Art

Regarding a Si (silicon) MOSFET (Metal Oxide Semiconductor Field Effect Transistor), which is a pervasive power semiconductor device, a main determination factor for breakdown voltage is the upper limit of electric field strength with which a drift layer serving as a breakdown voltage holding region can withstand. Such a drift layer formed of Si can be broken at a portion fed with an electric field of approximately 0.3 MV/cm or more. Hence, it is necessary to suppress the electric field strength to less than a predetermined value in the whole of the drift layer of the MOSFET. The simplest method to suppress is to decrease an impurity concentration of the drift layer. However, with this method, the on-resistance of the MOSFET becomes large, disadvantageously. In other words, there is a trade-off relation between the on-resistance and the breakdown voltage.

Japanese Patent Laying-Open No. 9-191109 describes such a trade-off relation between the on-resistance and the breakdown voltage in a typical Si MOSFET while considering a theoretical limit resulting from a property value of Si. In order to overcome this trade off, it is disclosed to add a lower p type buried layer and an upper p type buried layer in an n base layer disposed on an n type substrate disposed on a drain electrode. By the lower p type buried layer and the upper buried layer, the n base layer is divided into a lower stage, a middle stage, and an upper stage, each of which has the same thickness. According to one embodiment described in this patent publication, when an applied voltage reaches 200 V, punch through first occurs in the upper stage. Further, when the applied voltage reaches 400 V, punch through occurs in the middle stage. Furthermore, when the applied voltage reaches 600 V, punch through occurs in the lower stage. The stages in each of which the punch through has occurred hold equal voltages and the maximum electric field of each stage is maintained to be equal to or less than a limit electric field strength.

In order to further improve the above-described trade off, in recent years, it has been actively discussed to use SiC (silicon carbide) instead of Si. Unlike Si, SiC is a material capable of sufficiently withstanding an electric field strength of not less than 0.4 MV/cm.

A problem arising under application of such a high electric field is breakdown resulting from concentrated electric fields at a specific location in the MOSFET structure. For example, in the case of a trench type MOSFET, a main determination factor for breakdown voltage is a breakdown phenomenon of a gate insulating film. The breakdown phenomenon occurs at a bottom portion of the trench, in particular, a corner portion thereof, due to concentrated electric fields in the gate insulating film. Thus, the determination factor for breakdown voltage in the Si semiconductor device and the determination factor for breakdown voltage in the SiC semiconductor device are different from each other. Hence, if the technique of the above-described patent publication, which presumably assumes use of Si, is simply applied to improve the breakdown voltage of the SiC semiconductor device, the breakdown voltage cannot be improved by sufficiently using advantages in physical properties of SiC.

SUMMARY OF THE INVENTION

The present invention has been made to solve the foregoing problem and has its object to provide a silicon carbide semiconductor device having a high breakdown voltage and a low on-resistance.

A silicon carbide semiconductor device of the present invention includes a first electrode, a first drift layer, a relaxation region, a second drift layer, a body region, a source region, a second electrode, a gate insulating film, and a gate electrode. The first drift layer has a first surface facing the first electrode and electrically connected to the first electrode and a second surface opposite to the first surface. The first drift layer has first conductivity type, and has an impurity concentration $N_A$. The relaxation region is provided in a portion of the second surface of the first drift layer, and has a distance $L_A$ from the first surface. The relaxation region has second conductivity type. The second drift layer has a third surface in contact with the second surface and a fourth surface opposite to the third surface. The second drift layer has the first conductivity type. The first drift layer and the second drift layer form a drift region in which the relaxation region is buried. The second drift layer has an impurity concentration $N_B$, $N_B > N_A$ being satisfied. The body region is provided on the fourth surface of the second drift layer. The body region has the second conductivity type. The source region is provided on the body region, and is separated from the drift region by the body region. The source region has the first conductivity type. The second electrode is electrically connected to the source region. The gate insulating film includes a portion on the body region to connect the source region and the second drift layer to each other. The gate electrode is provided on the gate insulating film.

According to the present invention, there is obtained a silicon carbide semiconductor device having a high breakdown voltage and a low on-resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
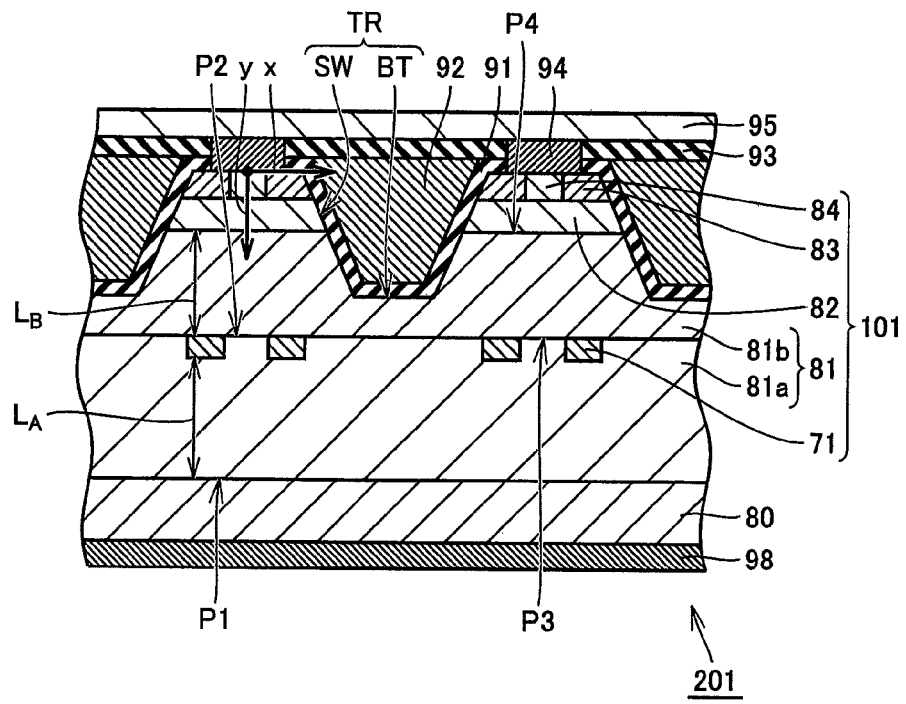
FIG. 1 is a partial cross sectional view schematically showing a configuration of a silicon carbide semiconductor device in a first embodiment of the present invention.

The following describes embodiments of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

First, the following items (i) to (vii) provide the gist of the embodiments.

(i) Each of silicon carbide semiconductor devices 201, 202 includes a first electrode 98, a first drift layer 81a, a relaxation region 71, a second drift layer 81b, a body region 82, a source region 83, a second electrode 94, a gate insulating film 91, and a gate electrode 92. First drift layer 81a has a first surface P1 facing first electrode 98 and electrically connected to first electrode 98 and a second surface P2 opposite to first surface P1. First drift layer 81a has first conductivity type, and has an impurity concentration $N_A$. Relaxation region 71 is provided in a portion of second surface P2 of first drift layer 81a, and has a distance $L_A$ from first surface P1. Relaxation region 71 has second conductivity type. Second drift layer 81b has a third surface P3 in contact with second surface P2, and a fourth surface P4 opposite to third surface P3. Second drift layer 81b has the first conductivity type. First drift layer 81a and second drift layer 81b form a drift region 81 in which relaxation region 71 is buried. Second drift layer 81b has an impurity concentration $N_B$, $N_B > N_A$ being satisfied. Body region 82 is provided on fourth surface P4 of second drift layer 81b. The body region has the second conductivity type. Source region 83 is provided on body region 82, and is separated from the drift region by body region 82. Source region 83 has the first conductivity type. Second electrode 94 is electrically connected to source region 83. Gate insulating film 91 includes a portion on body region 82 to connect source region 83 and second drift layer 81b to each other. Gate electrode 92 is provided on gate insulating film 91.

According to each of silicon carbide semiconductor devices 201, 202, $N_B > N_A$ is satisfied. Accordingly, when a voltage is applied between first electrode 98 and second electrode 94, a depletion layer is more facilitated to expand from relaxation region 71 to first drift layer 81a as compared with extension of a depletion layer from body region 82 to second drift layer 81b. Thus, a large ratio of the applied voltage is held by first drift layer 81a. Hence, electric field strength can be suppressed in second drift layer 81b. Breakdown of the silicon carbide semiconductor device is likely to occur in the second drift layer or a structure provided thereon. Hence, by suppressing electric field strength in second drift layer 81b as described above, the breakdown voltage of each of silicon carbide semiconductor devices 201, 202 can be increased.

Further, the impurity concentration of second drift layer 81b is higher than that in the case where $N_B \leq N_A$ is satisfied, so that electric resistance of second drift layer 81b can be made low. This leads to a small on-resistance of each of silicon carbide semiconductor devices 201, 202.

As described above, there is obtained each of silicon carbide semiconductor devices 201, 202 having a high breakdown voltage and a low on-resistance.

(ii) Third surface P3 may have a distance $L_B$ from fourth surface P4 and $L_A > L_B$ may be satisfied.

In this way, the ratio of voltage held by the first drift layer can be more increased. Accordingly, the breakdown voltage can be more increased.

(iii) In item (ii) described above, $L_A > 2 \cdot L_B$ may be satisfied.

In this way, the ratio of voltage held by first drift layer 81a can be further increased. Accordingly, the breakdown voltage can be more increased.

(iv) $L_A > 5$ μm may be satisfied.

Accordingly, a depletion layer having a length of 5 μm at maximum can be formed between relaxation region 71 and first surface P1. In other words, a depletion layer having a sufficient length can be formed more securely between relaxation region 71 and first surface P1. Therefore, the breakdown voltage of each of silicon carbide semiconductor devices 201, 202 can be more increased.

(v) Relaxation region 71 may have a dose amount $D_R$ and $L_A \cdot N_A < D_R$ may be satisfied. Here, the term "dose amount" is intended to mean an amount of impurity per unit area. The unit area is a unit area in a plane perpendicular to the thickness direction.

Accordingly, when each of silicon carbide semiconductor devices 201, 202 is turned off to increase a voltage between first electrode 98 and second electrode 94, relaxation region 71 can be prevented from being completely depleted before the depletion layer sufficiently extends from relaxation region 71 toward first surface P1. In this way, a depletion layer having a sufficient length can be formed between relaxation region 71 and first surface P1 in first drift layer 81a. Accordingly, a larger ratio of the voltage between first electrode 98 and second electrode 94 is held by first drift layer 81a. In other words, the voltage held by second drift layer 81b is reduced. In this way, electric field strength can be further suppressed at the portion at which breakdown is likely to occur due to concentrated electric fields. Accordingly, the breakdown voltage of the silicon carbide semiconductor device is further increased.

(vi) In silicon carbide semiconductor device 201, a trench TR may be provided to have a side wall surface SW. Side wall surface SW extends into second drift layer 81b through source region 83 and body region 82. Further, side wall surface SW is separated from first drift layer 81a. Gate electrode 92 is disposed on side wall surface SW with gate insulating film 91 being interposed therebetween.

In such a trench type silicon carbide semiconductor device, breakdown of the gate insulating film in the vicinity of an end portion of side wall surface SW extending into the second drift layer is likely to be a determination factor for breakdown voltage of the silicon carbide semiconductor device. Even in such a case, with the feature of item (i) described above, a sufficient breakdown voltage can be secured while suppressing the on-resistance.

(vii) In silicon carbide semiconductor device 202, a flat surface PF may be provided to have a portion constituted of each of source region 83P, body region 82P, and second drift layer 81b and to be in parallel with fourth surface P4 of second drift layer 81b. Gate electrode 92P is disposed on flat surface PF with gate insulating film 91P being interposed therebetween.

In such a planar type silicon carbide semiconductor device 202, breakdown in the vicinity of an interface between second drift layer 81b and body region 82P is likely to be a determination factor for breakdown voltage of silicon carbide semiconductor device 202. Even in such a case, with the feature of item (i) described above, a sufficient breakdown voltage can be secured while suppressing the on-resistance.

For more detailed description of the embodiments of the invention of the present application, the following illustrates first and second embodiments and supplementary matters.

First Embodiment

Figure 2:
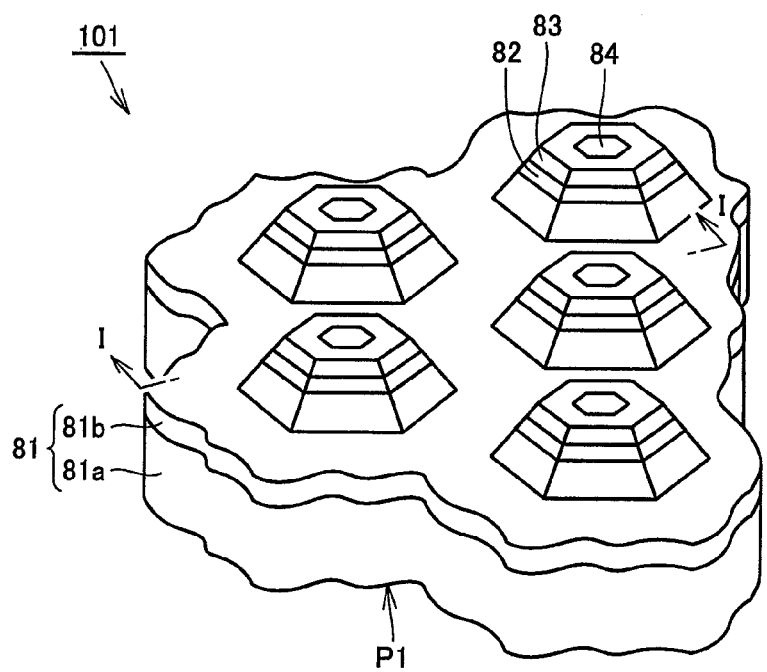
FIG. 2 is a partial perspective view schematically showing a shape of a silicon carbide layer provided in the silicon carbide semiconductor device of FIG. 1.
Figure 3:
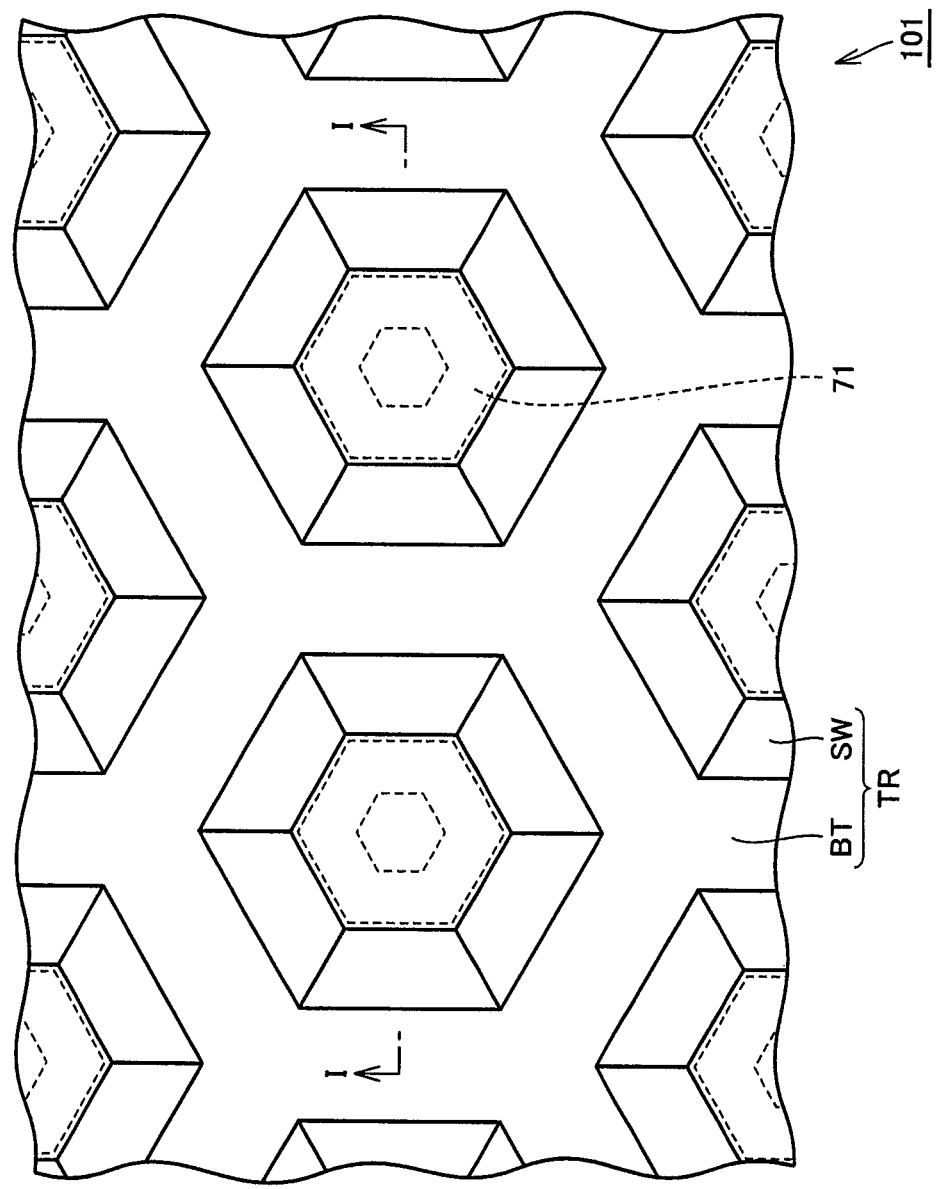
FIG. 3 is a partial top view schematically showing the shape of the silicon carbide layer provided in the silicon carbide semiconductor device of FIG. 1.

As shown in FIG. 1 to FIG. 3, a MOSFET 201 (silicon carbide semiconductor device) of the present embodiment includes a single-crystal substrate 80, an epitaxial layer 101 (silicon carbide layer), gate oxide films 91 (gate insulating film), gate electrodes 92, interlayer insulating films 93, source electrodes 94 (second electrode), a source interconnection layer 95, and a drain electrode 98 (first electrode). MOSFET 201 preferably has a breakdown voltage of not less than 600 V between drain electrode 98 and each source electrode 94. In other words, MOSFET 201 is preferably a power semiconductor device having a high breakdown voltage.

Single-crystal substrate 80 is made of silicon carbide and has n type (first conductivity type) conductivity. Single-crystal substrate 80 has one surface (upper surface in the figure) on which epitaxial layer 101 is provided, and has the other surface (lower surface in the figure) on which drain electrode 98 serving as an ohmic electrode is provided. Single-crystal substrate 80 preferably has a hexagonal crystal structure of polytype 4H.

Epitaxial layer 101 is a silicon carbide layer epitaxially grown on single-crystal substrate 80. Epitaxial layer 101 preferably has a hexagonal crystal structure of polytype 4H. Epitaxial layer 101 has relaxation regions 71, a drift region 81, body regions 82, source regions 83, and contact regions 84.

Drift region 81 has n type conductivity. Drift region 81 has a lower drift layer 81a (first drift layer) and an upper drift layer 81b (second drift layer). Lower drift layer 81a has a first surface P1, and a second surface P2 opposite to first surface P1. First surface P1 faces drain electrode 98, and is electrically connected to drain electrode 98 via single-crystal substrate 80. Lower drift layer 81a has n type conductivity, and has an impurity concentration $N_A$.

Relaxation regions 71 are formed in portions of second surface P2 of lower drift layer 81a, and has a distance $L_A$ from first surface P1. Preferably, $L_A > 5$ μm is satisfied. Each of relaxation regions 71 has p type (second conductivity type) conductivity, and contains an impurity, such as aluminum, added therein. Relaxation region 71 has a dose amount $D_R$. Here, the term "dose amount" is intended to mean an amount of impurity per unit area. The unit area is a unit area in a plane perpendicular to the thickness direction (vertical direction in FIG. 1). In other words, the dose amount is a value obtained by integrating an impurity concentration per unit volume in the thickness direction. Preferably, $L_A \cdot N_A < D_R$ is satisfied. Relaxation region 71 preferably has a dose amount of not less than $1 \times 10^{12}$ cm$^{-2}$, more preferably, not less than $1 \times 10^{13}$ cm$^{-2}$. This dose amount is preferably not more than $1 \times 10^{15}$ cm$^{-2}$. This dose amount is, for example, $3 \times 10^{13}$ cm$^{-2}$.

Upper drift layer 81b is provided on second surface P2 of lower drift layer 81a. Upper drift layer 81b has a third surface P3 in contact with second surface P2, and a fourth surface P4 opposite to third surface P3. Third surface P3 has a distance $L_B$ from fourth surface P4. In other words, upper drift layer 81b has a thickness $L_B$. Distance $L_A$ between relaxation region 71 and first surface P1 and distance $L_B$ between third surface P3 and fourth surface P4 preferably satisfy $L_A > L_B$, more preferably, $L_A > 2 \cdot L_B$. Lower drift layer 81a and upper drift layer 81b form drift region 81 in which relaxation regions 71 are buried. In other words, upper drift layer 81b covers relaxation regions 71. Upper drift layer 81b has n type conductivity, and has an impurity concentration $N_B$.

Between impurity concentration $N_A$ of lower drift layer 81a and impurity concentration $N_B$ of upper drift layer 81b, the following relation is satisfied: $N_B > N_A$. Impurity concentration $N_A$ is preferably not less than $3 \times 10^{15}$ cm$^{-3}$ and not more than $1 \times 10^{16}$ cm$^{-3}$, for example, $4 \times 10^{15}$ cm$^{-3}$. Impurity concentration $N_B$ is preferably not less than $7 \times 10^{15}$ cm$^{-3}$ and not more than $5 \times 10^{16}$ cm$^{-3}$, for example, $7.5 \times 10^{15}$ cm$^{-3}$. Single-crystal substrate 80 preferably has an impurity concentration sufficiently larger than impurity concentration $N_A$. For example, single-crystal substrate 80 has an impurity concentration 50 times or more as large as impurity concentration $N_A$. In such a case, single-crystal substrate 80 does not have a function as a drift region, i.e., does not substantially have a breakdown voltage holding function.

Each of body regions 82 is provided on fourth surface P4 of upper drift layer 81b. The body region has p type conductivity. Body region 82 is separated from relaxation region 71 by upper drift layer 81b. Body region 82 preferably has an impurity concentration of not less than $1\times10^{17}$ cm$^{-3}$ and not more than $5\times10^{18}$ cm$^{-3}$, such as $1\times10^{18}$ cm$^{-3}$.

Source region 83 is provided on body region 82, and is separated from the drift region by body region 82. The source region has n type conductivity. Source region 83 and contact region 84 form the upper surface of epitaxial layer 101. Contact region 84 has p type conductivity. Contact region 84 is connected to body region 82.

In the MOSFET, a trench TR is provided in the upper surface of epitaxial layer 101. Trench TR has side wall surfaces SW and a bottom surface BT. Each of side wall surfaces SW extends into upper drift layer 81b through source region 83 and body region 82. Accordingly, side wall surface SW includes a channel surface of MOSFET 201 on body region 82. Side wall surface SW is separated from lower drift layer 81a. Bottom surface BT is located in upper drift layer 81b. In the present embodiment, bottom surface BT has a flat shape substantially parallel to the upper surface. Bottom surface BT and side wall surface SW are connected to each other at a portion that forms a corner portion of trench TR. In the present embodiment, trench TR extends to form a mesh having a honeycomb structure when viewed in a plan view (FIG. 3). In this way, epitaxial layer 101 has its upper surface having a hexagonal shape surrounded by trench TR. Side wall surface SW is inclined relative to the upper surface of epitaxial layer 101, and therefore expands in a tapered manner toward the opening of trench TR. Side wall surface SW preferably has a plane orientation inclined relative to the {0001} plane by not less than 50° and not more than 65°, more preferably, inclined relative to the (000-1) plane by not less than 50° and not more than 65°. Preferably, side wall surface SW has a predetermined crystal plane (also referred to as "special plane") particularly at a portion on body region 82. Details of the special plane will be described later.

Preferably, when viewed in a plan view, relaxation region 71 is disposed only external to bottom surface BT of trench TR as shown in FIG. 3. In the present embodiment, relaxation region 71 has an opening when viewed in a plan view. Specifically, relaxation region 71 has outer edge and opening substantially similar to the upper surface having the hexagonal shape.

Gate oxide film 91 covers each of side wall surfaces SW and bottom surface BT of trench TR. Thus, gate oxide film 91 includes a portion on body region 82 to connect source region 83 and upper drift layer 81b to each other. Gate electrode 92 is provided on gate oxide film 91. In this way, gate electrode 92 has a portion disposed on side wall surface SW with gate oxide film 91 being interposed therebetween.

Source electrode 94 is in contact with and therefore is electrically connected to each of source regions 83 and contact region 84. Source interconnection layer 95 is in contact with source electrode 94. Source interconnection layer 95 is, for example, an aluminum layer. Interlayer insulating film 93 insulates between gate electrode 92 and source interconnection layer 95.

According to the present embodiment, MOSFET 201 is provided with trench TR having side wall surface SW. Side wall surface SW extends into upper drift layer 81b through source region 83 and body region 82, and is separated from lower drift layer 81a. Gate electrode 92 is disposed on side wall surface SW with gate oxide film 91 being interposed therebetween. In such a trench type MOSFET 201, breakdown of gate insulating film 91 in the vicinity of the end portion of side wall surface SW extending into lower drift layer 81b (corner portion of trench TR) is likely to be a determination factor for the breakdown voltage of MOSFET 201.

Here, $N_B > N_A$ is satisfied between impurity concentration $N_A$ of lower drift layer 81a and impurity concentration $N_B$ of upper drift layer 81b. Hence, when a voltage is applied between drain electrode 98 and source electrode 94, a depletion layer is more facilitated to extend from relaxation region 71 to lower drift layer 81a as compared with extension of a depletion layer from body region 82 to upper drift layer 81b. Thus, a large ratio of the applied voltage is held by lower drift layer 81a. Hence, electric field strength can be suppressed in upper drift layer 81b. As described above, the breakdown of MOSFET 201 is likely to occur at gate insulating film 91 on lower drift layer 81b. Hence, by suppressing electric field strength in upper drift layer 81b, the breakdown voltage of MOSFET 201 can be increased.

Further, the impurity concentration of upper drift layer 81b is higher than that in the case where $N_B \leq N_A$ is satisfied, so that electric resistance of upper drift layer 81b can be made low. Accordingly, the on-resistance of MOSFET 201 can be made low.

As described above, there is obtained MOSFET 201 having a high breakdown voltage and a low on-resistance.

When $L_A > L_B$ is satisfied between distances $L_A$ and $L_B$ (FIG. 1), in particular, when $L_A > 2 \cdot L_B$ is satisfied, the ratio of voltage held by lower drift layer 81a can be further increased. Accordingly, the breakdown voltage can be more increased.

When $L_A > 5$ μm is satisfied, a depletion layer having a length of 5 μm at maximum can be formed between relaxation region 71 and first surface P1. In other words, a depletion layer having a sufficient length can be formed more securely between relaxation region 71 and first surface P1. Accordingly, the breakdown voltage of MOSFET 201 can be further increased.

When $L_A \cdot N_A < D_R$ is satisfied and MOSFET 201 is turned off to increase a voltage between drain electrode 98 and source electrode 94, relaxation region 71 can be prevented from being completely depleted before the depletion layer sufficiently extends from relaxation region 71 toward first surface P1. Accordingly, a depletion layer having a sufficient length can be formed between relaxation region 71 and first surface P1 in lower drift layer 81a. Accordingly, a larger ratio of voltage between drain electrode 98 and source electrode 94 is held by lower drift layer 81a. In other words, the voltage held by upper drift layer 81b is reduced. In this way, electric field strength can be further suppressed at the portion at which breakdown is likely to occur due to concentrated electric fields. Accordingly, the breakdown voltage of MOSFET 201 is further increased.

Further, lower drift layer 81a and drain electrode 98 are electrically connected to each other via single-crystal substrate 80 having an impurity concentration higher than impurity concentration $N_A$. Thus, the contact resistance of drain electrode 98 can be reduced. Accordingly, the electric resistance of drift region 81 can be increased by the reduced contact resistance. Hence, the impurity concentration of drift region 81 can be further reduced. Therefore, the breakdown voltage of MOSFET 201 can be further increased.

When relaxation region 71 is disposed external to bottom surface BT of trench TR when viewed in a plan view (FIG. 3) and MOSFET 201 is turned off, the depletion layer extends from relaxation region 71 to the corner portion of trench TR at the edge of bottom surface BT of trench TR. This provides further increased effect of the electric field relaxation structure.

The following describes a method of manufacturing MOSFET 201 (FIG. 1).

Figure 4:
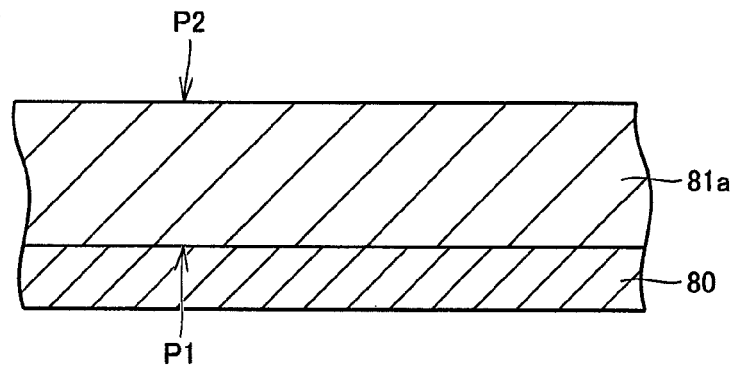
FIG. 4 is a partial cross sectional view schematically showing a first step in a method of manufacturing the silicon carbide semiconductor device of FIG. 1.

As shown in FIG. 4, lower drift layer 81*a* is formed on single-crystal substrate 80. Specifically, lower drift layer 81*a* is formed through epitaxial growth on single-crystal substrate 80. This epitaxial growth can be achieved by employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as an impurity, for example.

Figure 5:
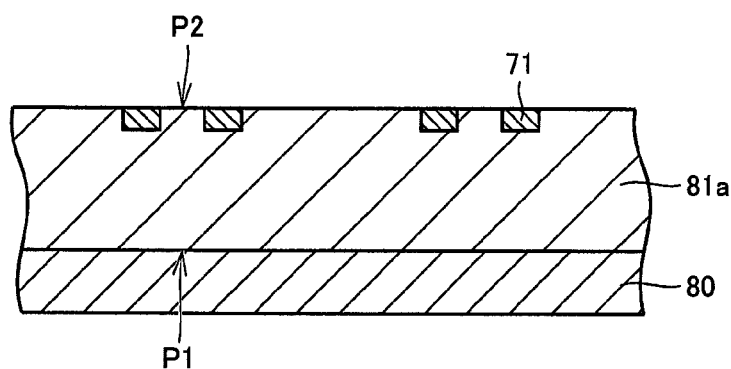
FIG. 5 is a partial cross sectional view schematically showing a second step of the method of manufacturing the silicon carbide semiconductor device of FIG. 1.

As shown in FIG. 5, relaxation regions 71 having p type conductivity are formed in portions of second surface P2 of lower drift layer 81*a*. Specifically, in second surface P2, acceptor ions (impurity ions for providing second conductivity type) are implanted using an implanting mask (not shown).

Figure 6:
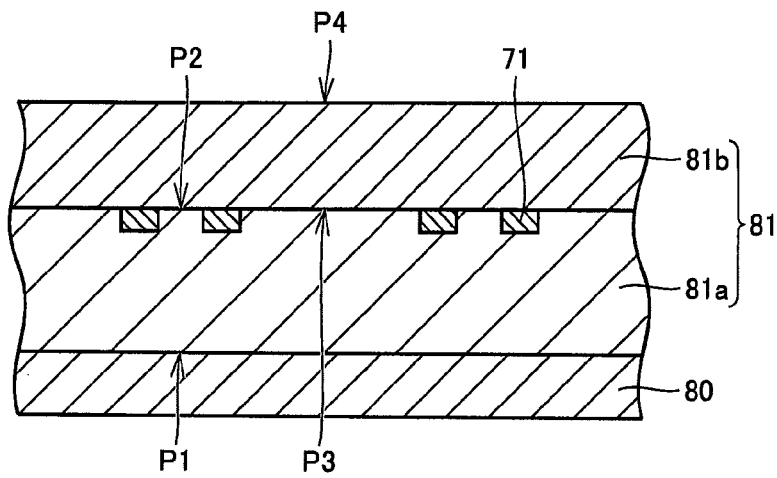
FIG. 6 is a partial cross sectional view schematically showing a third step of the method of manufacturing the silicon carbide semiconductor device of FIG. 1.

As shown in FIG. 6, after relaxation regions 71 are formed, upper drift layer 81*b* having n type conductivity is formed on second surface P2. Accordingly, relaxation regions 71 are buried in drift region 81 including lower drift layer 81*a* and upper drift layer 81*b*. Upper drift layer 81*b* can be formed using the same method as the method of forming lower drift layer 81*a*.

Figure 7:
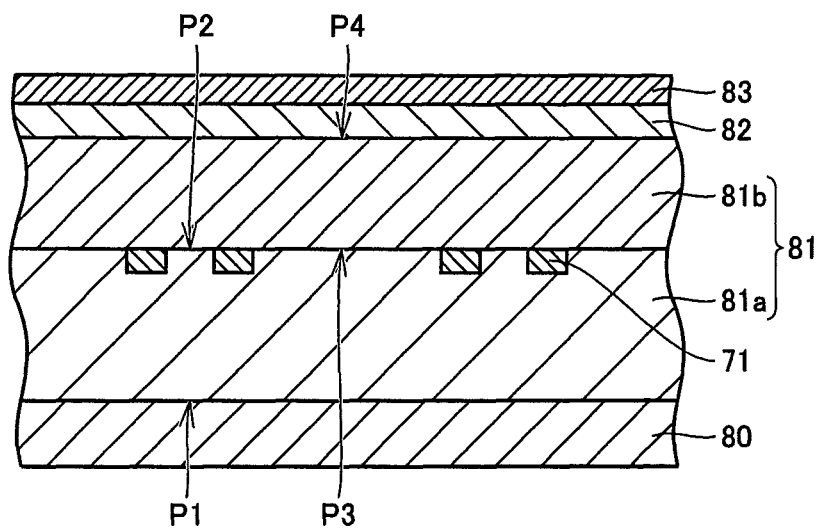
FIG. 7 is a partial cross sectional view schematically showing a fourth step of the method of manufacturing the silicon carbide semiconductor device of FIG. 1.
Figure 8:
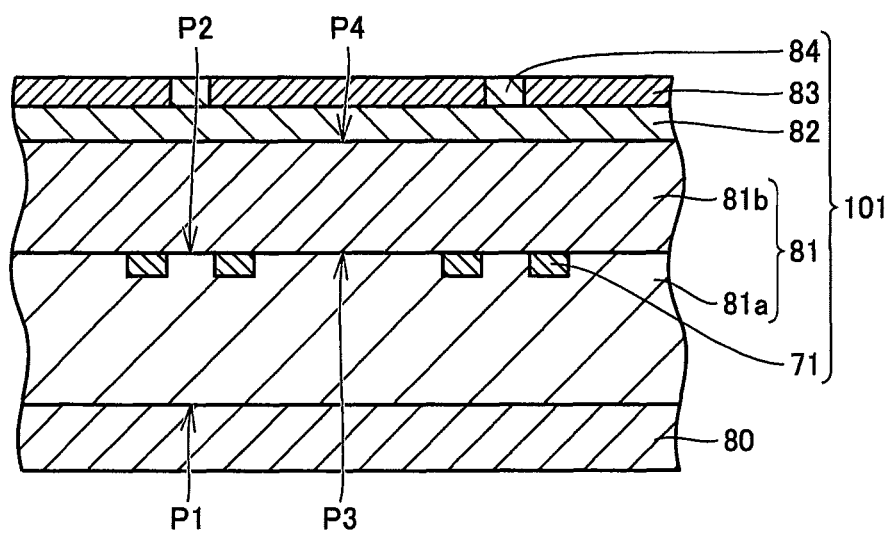
FIG. 8 is a partial cross sectional view schematically showing a fifth step of the method of manufacturing the silicon carbide semiconductor device of FIG. 1.

As shown in FIG. 7, body region 82 and source region 83 are formed on fourth surface P4 of upper drift layer 81*b*. As shown in FIG. 8, contact regions 84 are formed on body region 82. The formation of these can be performed by, for example, ion implantation into the fourth surface of upper drift layer 81*b* (FIG. 6). In the ion implantation for forming body region 82 and contact regions 84, ions of an impurity for providing p type conductivity such as aluminum (Al) are implanted. Meanwhile, in the ion implantation for forming source region 83, ions of an impurity for providing n type conductivity such as phosphorus (P) are implanted, for example. It should be noted that instead of the ion implantation, epitaxial growth involving addition of impurities may be employed.

Next, heat treatment is performed to activate the impurities. This heat treatment is preferably performed at a temperature of not less than 1500° C. and not more than 1900° C., for example, a temperature of approximately 1700° C. The heat treatment is performed for approximately 30 minutes, for example. The atmosphere in the heat treatment is preferably an inert gas atmosphere, such as Ar atmosphere.

Figure 9:
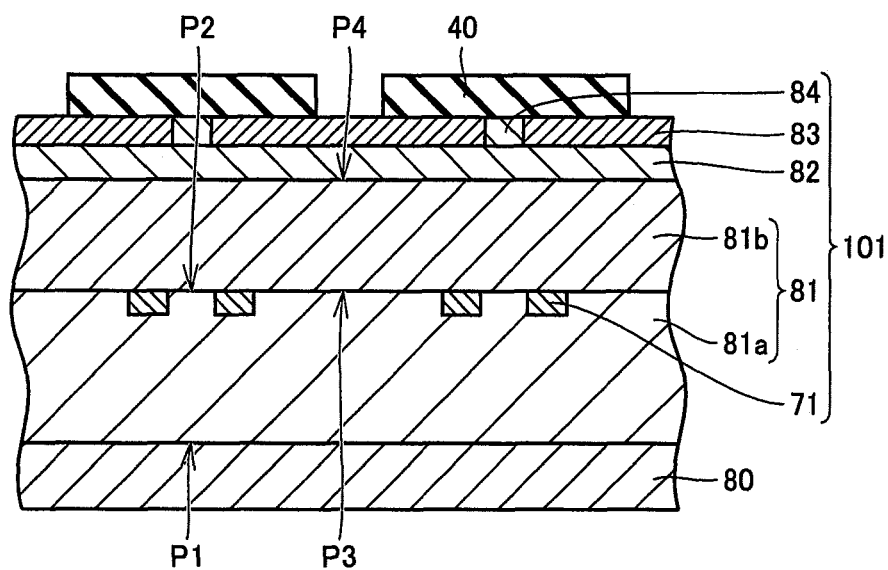
FIG. 9 is a partial cross sectional view schematically showing a sixth step of the method of manufacturing the silicon carbide semiconductor device of FIG. 1.

As shown in FIG. 9, a mask layer 40 having an opening is formed on the surface provided by source region 83 and contact region 84. As mask layer 40, a silicon oxide film or the like can be used, for example. The opening is formed to correspond to the location of trench TR (FIG. 1).

Figure 10:
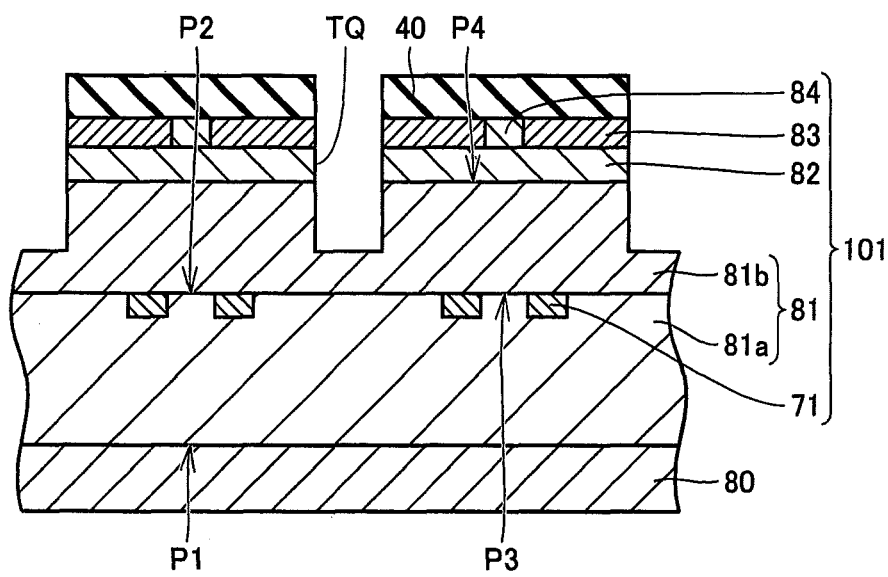
FIG. 10 is a partial cross sectional view schematically showing a seventh step of the method of manufacturing the silicon carbide semiconductor device of FIG. 1.

As shown in FIG. 10, in the opening of mask layer 40, source region 83, body region 82, and a portion of upper drift layer 81*b* are removed by etching. An exemplary, usable etching method is reactive ion etching (RIE), in particular, inductively coupled plasma (ICP) RIE. Specifically, for example, ICP-RIE can be employed which uses $SF_6$ or a mixed gas of $SF_6$ and $O_2$ as a reactive gas. By means of such etching, in the region where trench TR (FIG. 1) is to be formed, a recess TQ is formed which has side walls each substantially perpendicular to the upper surface.

Next, thermal etching is performed in recess TQ. This thermal etching can be performed by, for example, heating in an atmosphere containing a reactive gas having at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$. For example, the thermal etching is performed using a mixed gas of chlorine gas and oxygen gas as a reactive gas, at a heat treatment temperature of, for example, not less than 700° C. and not more than 1000° C.

It should be noted that the reactive gas may contain a carrier gas in addition to the chlorine gas and the oxygen gas. As the carrier gas, nitrogen ($N_2$) gas, argon gas, helium gas, or the like can be used, for example. When the heat treatment temperature is set at not less than 700° C. and not more than 1000° C. as described above, a rate of etching SiC is approximately, for example, 70 μm/hour. In addition, in this case, mask layer 40, which is formed of silicon oxide and therefore has a very large selection ratio relative to SiC, is not substantially etched during the etching of SiC.

Figure 11:
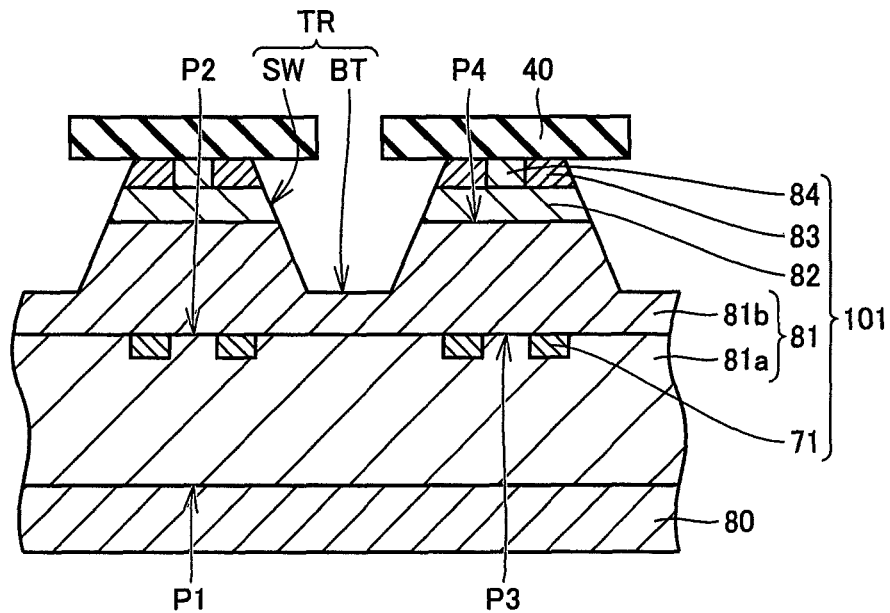
FIG. 11 is a partial cross sectional view schematically showing an eighth step of the method of manufacturing the silicon carbide semiconductor device of FIG. 1.

As shown in FIG. 11, by the above-described thermal etching, trench TR is formed in the upper surface of epitaxial layer 101. Preferably, during the formation of trench TR, the special plane is spontaneously formed on side wall surface SW, in particular, on body region layer 82. Next, mask layer 40 is removed by means of an appropriate method such as etching.

Figure 12:
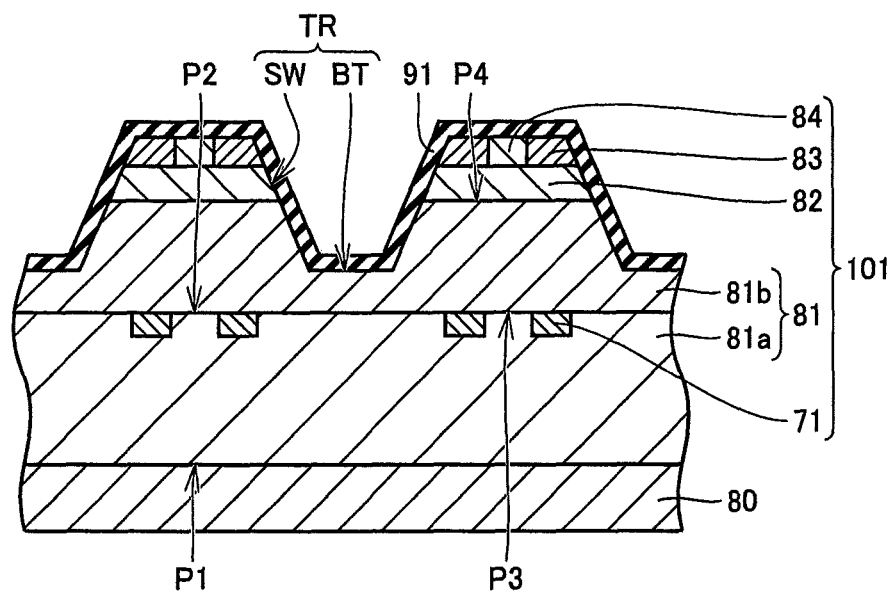
FIG. 12 is a partial cross sectional view schematically showing a ninth step of the method of manufacturing the silicon carbide semiconductor device of FIG. 1.

As shown in FIG. 12, gate oxide film 91 is formed to cover each of side wall surfaces SW and bottom surface BT of trench TR. Gate oxide film 91 can be formed by means of, for example, thermal oxidation. Thereafter, NO annealing may be performed using nitrogen monoxide (NO) gas as an atmospheric gas. A temperature profile has such a condition that the temperature is not less than 1100° C. and not more than 1300° C. and holding time is approximately 1 hour, for example. Accordingly, nitrogen atoms are introduced in an interface region between gate oxide film 91 and body region 82. As a result, formation of interface states in the interface region is suppressed, thereby achieving improved channel mobility. It should be noted that a gas other than the NO gas may be employed as the atmospheric gas as long as the nitrogen atoms can be thus introduced. After this NO annealing, Ar annealing may be further performed using argon (Ar) as the atmospheric gas. The Ar annealing is preferably performed at a heating temperature higher than the heating temperature in the above-described NO annealing and lower than the melting point of gate oxide film 91. This heating temperature is held for approximately 1 hour, for example. Accordingly, formation of interface states in the interface region between gate oxide film 91 and body region 82 is further suppressed. It should be noted that instead of the Ar gas, another inert gas such as nitrogen gas may be employed as the atmospheric gas.

Figure 13:
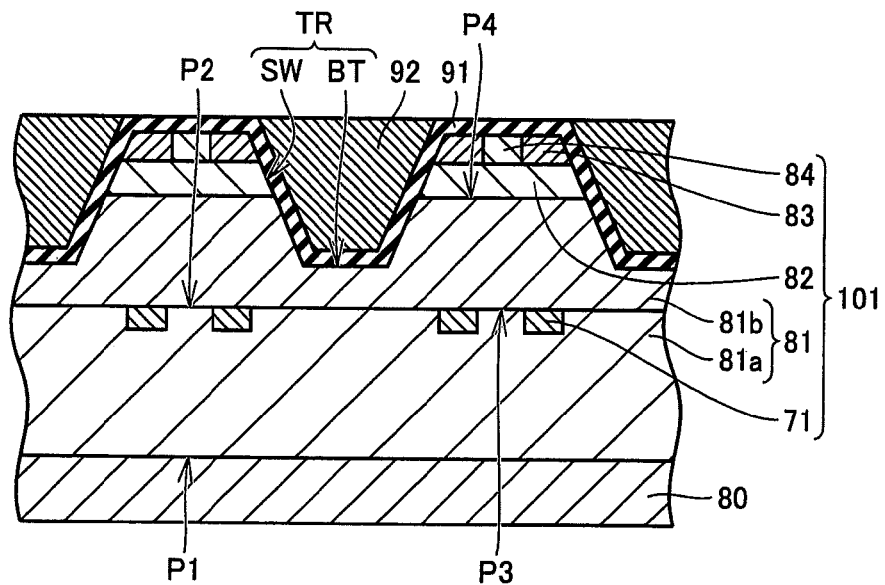
FIG. 13 is a partial cross sectional view schematically showing a tenth step of the method of manufacturing the silicon carbide semiconductor device of FIG. 1.

As shown in FIG. 13, gate electrode 92 is formed on gate oxide film 91. Specifically, gate electrode 92 is formed on gate oxide film 91 so as to fill the region within trench TR with gate oxide film 91 interposed therebetween. A method of forming gate electrode 92 can be performed by, for example, forming a film of conductor or doped silicon and performing CMP (Chemical Mechanical Polishing).

Figure 14:
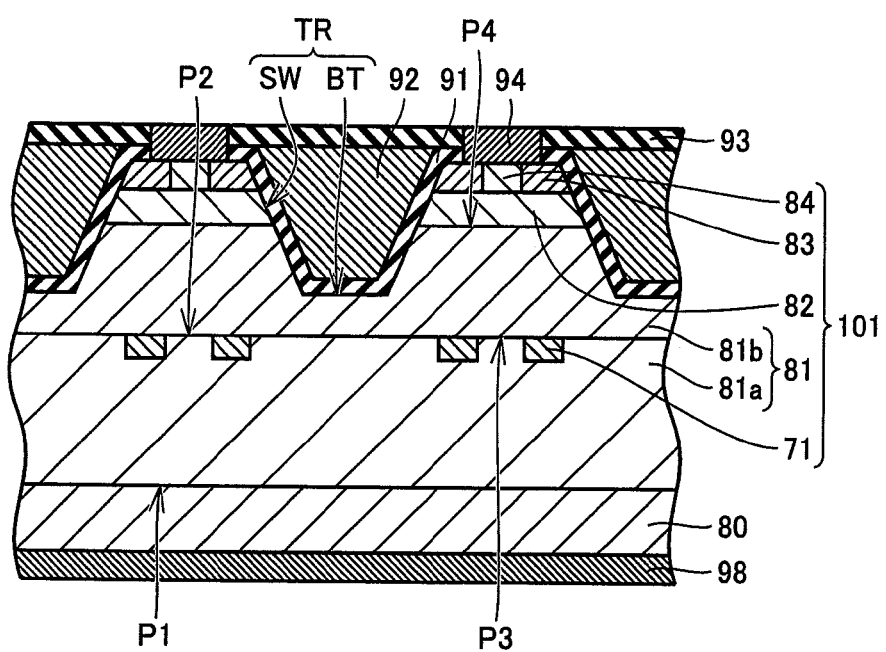
FIG. 14 is a partial cross sectional view schematically showing an eleventh step of the method of manufacturing the silicon carbide semiconductor device of FIG. 1.

Referring to FIG. 14, interlayer insulating film 93 is formed on gate electrode 92 and gate oxide film 91 so as to cover the exposed surface of gate electrode 92. Etching is performed to form openings in interlayer insulating film 93 and gate oxide film 91. Through the openings, each of source region 83 and contact region 84 is exposed on the upper surface. Next, on the upper surface, source electrode 94 is formed in contact with each of source region 83 and contact region 84. Drain electrode 98 is formed on first surface P1, which is provided by drift region 81, with single-crystal substrate 80 interposed therebetween.

Referring to FIG. 1 again, source interconnection layer 95 is formed. In this way, MOSFET 201 is obtained.

(Special Plane)

Figure 15:
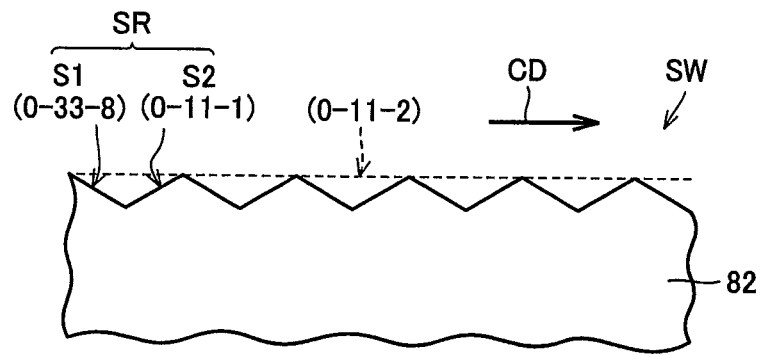
FIG. 15 is a partial cross sectional view schematically showing a fine structure of a surface of the silicon carbide layer provided in the silicon carbide semiconductor device.

Side wall surface SW described above has the special plane particularly at its portion on body region 82. Side wall surface SW having the special plane includes a plane S1 having a plane orientation of {0-33-8} as shown in FIG. 15. In other words, on side wall surface SW of trench TR, body region 82 is provided with a surface including plane S1. Plane S1 preferably has a plane orientation of (0-33-8).

More preferably, side wall surface SW microscopically includes plane S1, and side wall surface SW microscopically further includes a plane S2 having a plane orientation of {0-11-1}. Here, the term "microscopically" refers to "minutely to such an extent that at least the size about twice as large as an interatomic spacing is considered". As a method of observing such a microscopic structure, for example, a TEM (Transmission Electron Microscope) can be used. Plane S2 preferably has a plane orientation of (0-11-1).

Preferably, plane S1 and plane S2 of side wall surface SW form a combined plane SR having a plane orientation of {0-11-2}. Specifically, combined plane SR is constructed of periodically repeated planes S1 and S2. Such a periodic structure can be observed by, for example, TEM or AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, combined plane SR has a plane orientation of (0-11-2). In this case, combined plane SR has an off angle of 62° relative to the (000-1) plane, macroscopically.

Preferably, in the channel surface, carriers flow in a channel direction CD (i.e., the thickness direction of the MOSFET (vertical direction in FIG. 1 or the like), in which the above-described periodic repetition is done.

The following describes the detailed structure of combined plane SR.

Figure 16:
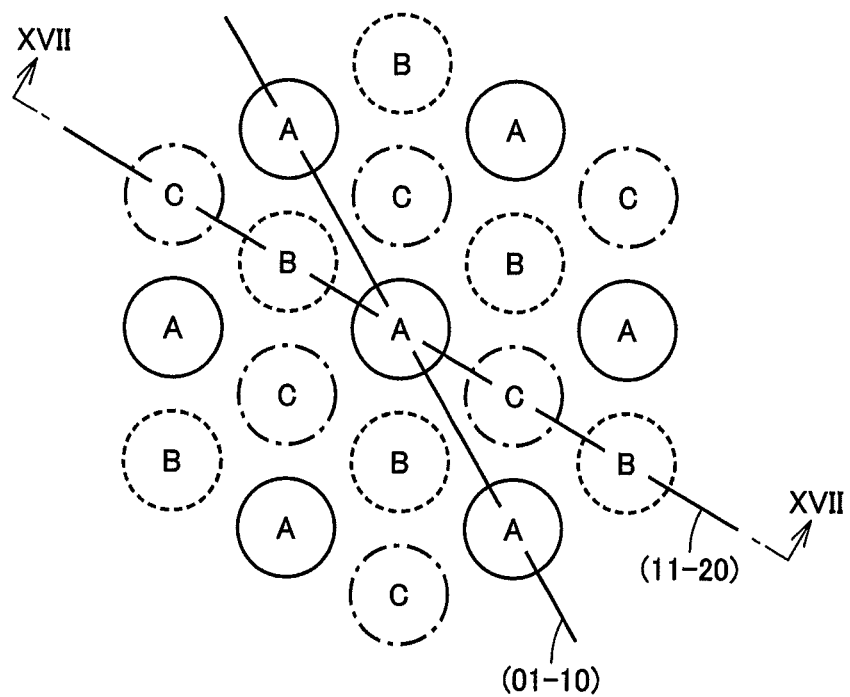
FIG. 16 shows a crystal structure of a (000-1) plane in a hexagonal crystal of polytype 4H.

Generally, regarding Si atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 16. In other words, with four layers ABCB being regarded as one period, a periodic stacking structure such as ABCBAB-CBABCB . . . is provided.

Figure 17:
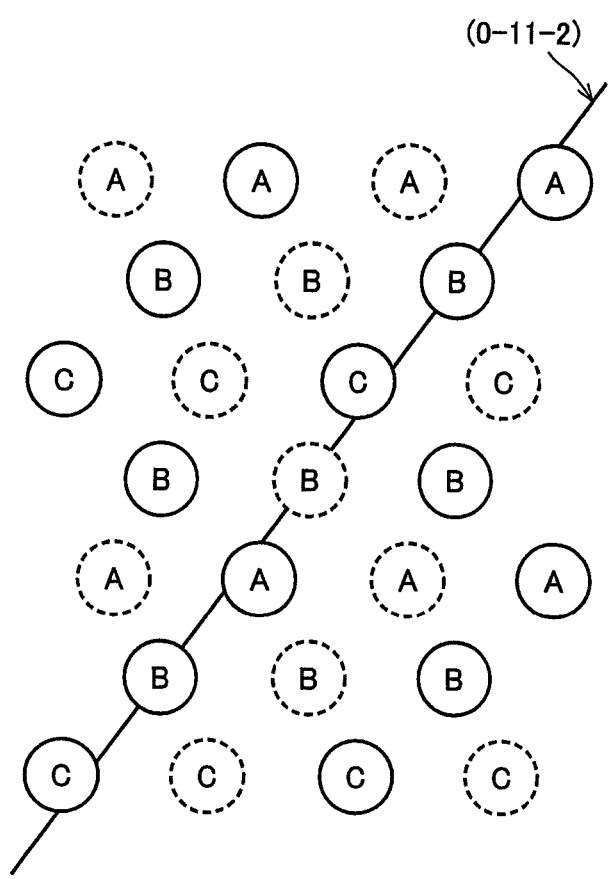
FIG. 17 shows a crystal structure of a (11-20) plane along a line XVII-XVII in FIG. 16.

As shown in FIG. 17, in the (11-20) plane (cross section taken along a line XVII-XVII of FIG. 16), atoms in each of four layers ABCB constituting the above-described one period are not aligned completely along the (0-11-2) plane. In FIG. 17, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being ignored is limited to (0-11-2), this surface can have various structures microscopically.

Figure 18:
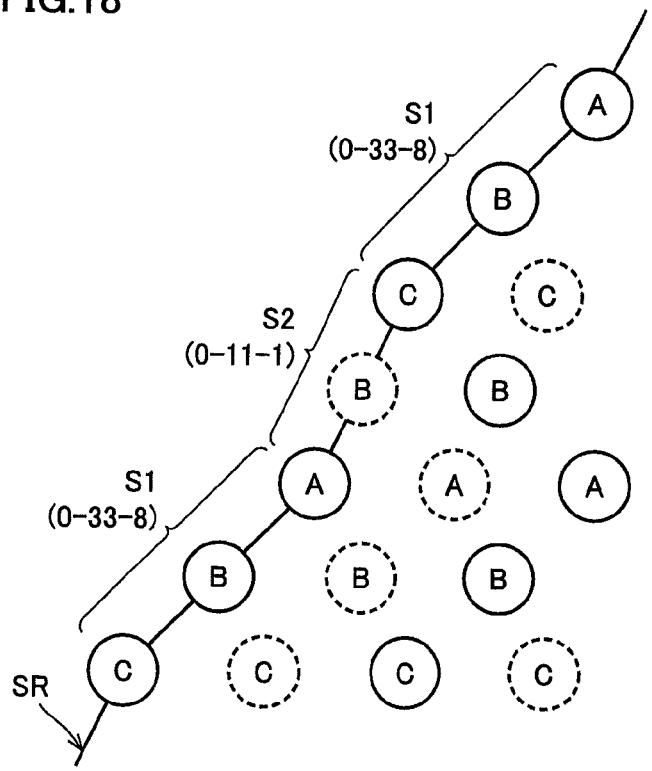
FIG. 18 shows a crystal structure of a combined plane of FIG. 15 within the (11-20) plane in the vicinity of the surface.

As shown in FIG. 18, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 17).

Figure 19:
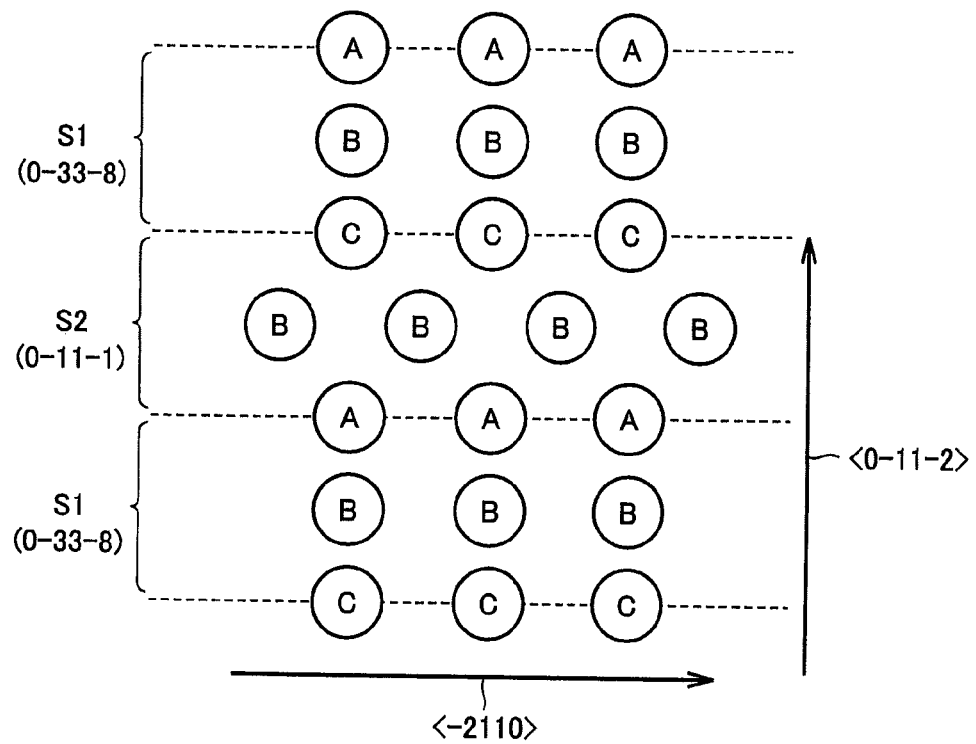
FIG. 19 shows the combined plane of FIG. 15 when viewed from the (01-10) plane.

As shown in FIG. 19, when viewing combined plane SR from the (01-10) plane, the single-crystal structure has a portion periodically including a structure (plane S1 portion) equivalent to a cubic structure. Specifically, combined plane SR is constructed by alternately providing planes Si having a plane orientation of (001) in the above-described structure equivalent to the cubic structure and planes S2 connected to planes S1 and having a plane orientation different from that of each of planes S1. Also in a polytype other than 4H, the surface can be constructed of the planes (planes S1 in FIG. 24) having a plane orientation of (001) in the structure equivalent to the cubic structure and the planes (planes S2 in FIG. 16) connected to the foregoing planes and having a plane orientation different from that of each of the foregoing planes. The polytype may be, for example, 6H or 15R.

Figure 20:
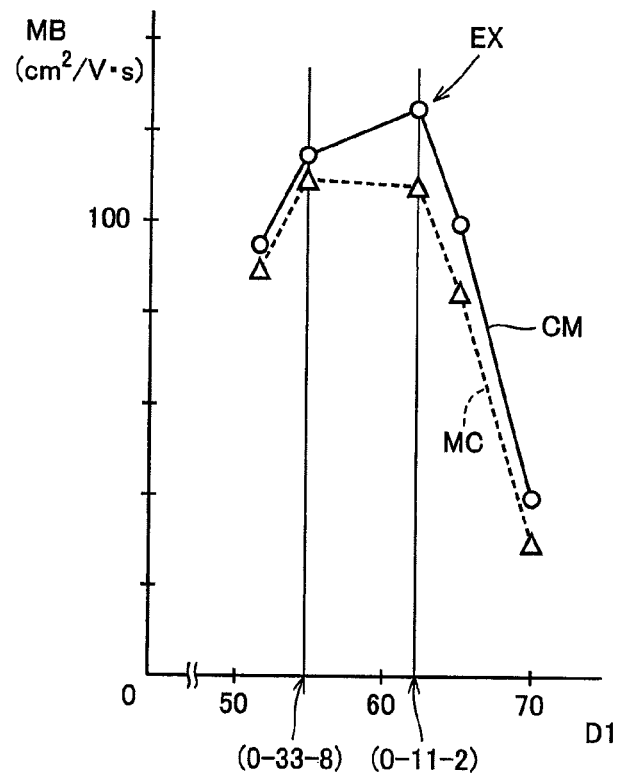
FIG. 20 is a graph showing an exemplary relation between channel mobility and an angle between a channel surface and the (000-1) plane when macroscopically viewed, in each of a case where thermal etching is performed and a case where no thermal etching is performed.

Referring to FIG. 20, the following describes a relation between the crystal plane of side wall surface SW and mobility MB of the channel surface. In the graph of FIG. 20, the horizontal axis represents an angle D1 formed by the (000-1) plane and the macroscopic plane orientation of side wall surface SW having the channel surface, whereas the vertical axis represents mobility MB. A group of plots CM correspond to a case where side wall surface SW is finished to have the special plane by thermal etching, whereas a group of plots MC correspond to a case where side wall SW is not thermally etched.

In group of plots MC, mobility MB is at maximum when the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 18 and FIG. 19, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 21:
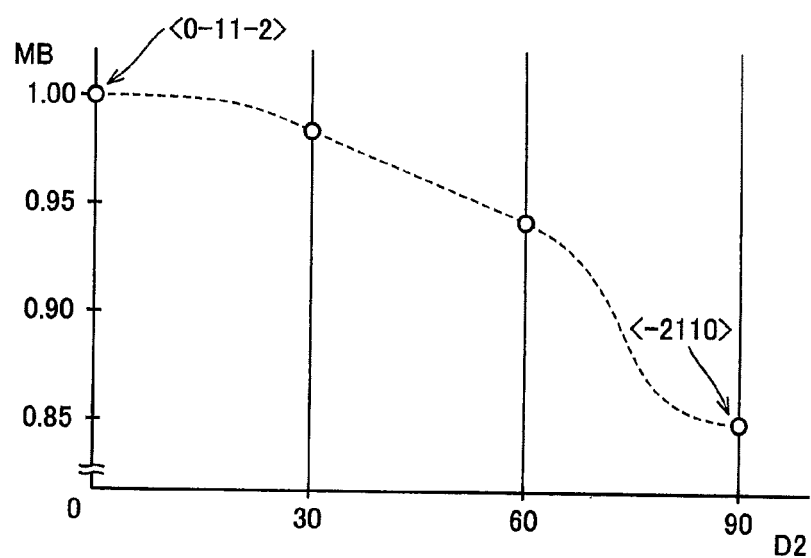
FIG. 21 is a graph showing an exemplary relation between the channel mobility and an angle between a channel direction and a <0-11-2> direction.

It should be noted that mobility MB has orientation dependency on combined plane SR. In a graph shown in FIG. 21, the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 15) preferably has an angle D2 of not less than 0° and not more than 60°, more preferably, substantially 0°.

Figure 22:
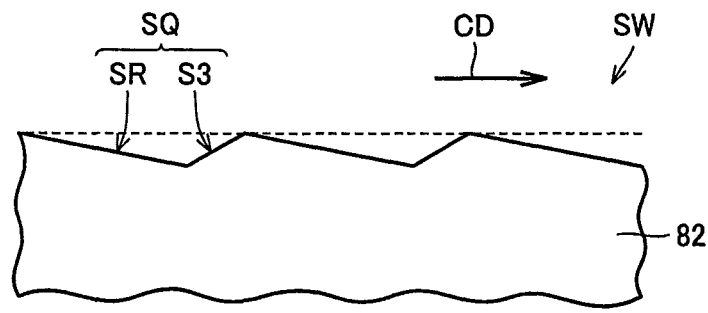
FIG. 22 shows a modification of FIG. 15.

As shown in FIG. 22, side wall surface SW may further include a plane S3 in addition to combined plane SR. More specifically, side wall surface SW may include a combined plane SQ constructed of periodically repeated plane S3 and combined plane SR. In this case, the off angle of side wall surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

Such a periodic structure can be observed by, for example, TEM or AFM.

Second Embodiment

Figure 23:
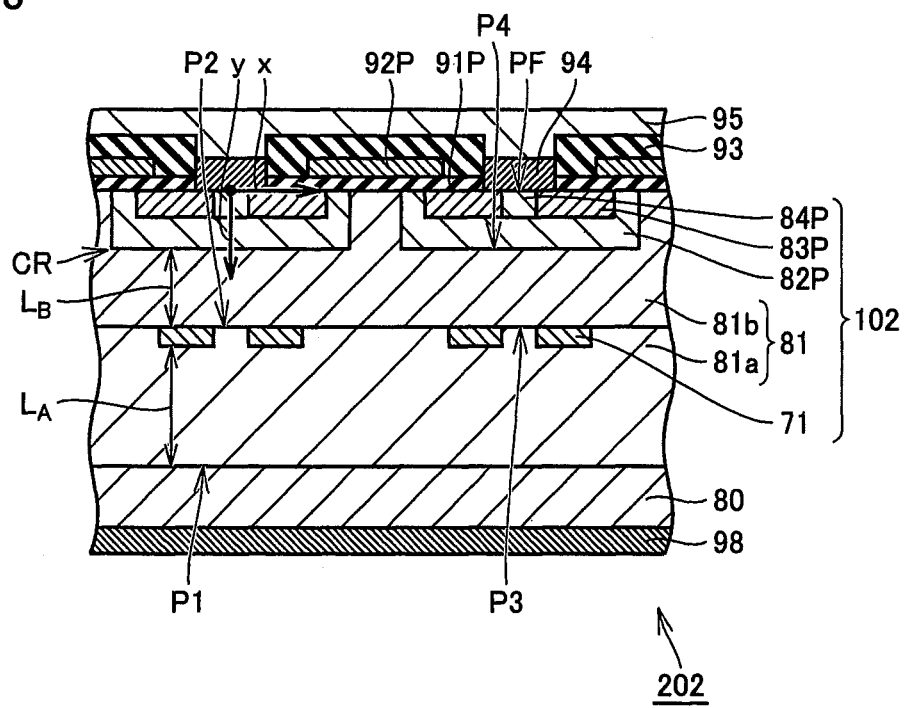
FIG. 23 is a partial cross sectional view schematically showing a configuration of a silicon carbide semiconductor device in a second embodiment of the present invention.

As shown in FIG. 23, a MOSFET 202 of the present embodiment is of a so-called planar type. An epitaxial layer 102 includes body regions 82P, source regions 83P, and contact regions 84P. MOSFET 202 is provided with a flat surface PF. Flat surface PF has a portion constituted of each of source regions 83P, body regions 82P, and upper drift layer 81b, and is in parallel with fourth surface P4 of upper drift layer 81b. Gate electrodes 92P are disposed on flat surface PF with gate oxide films 91P being interposed therebetween. It should be noted that configurations other than the above are substantially the same as those of the first embodiment. Hence, the same or corresponding elements are given the same reference characters and are not described repeatedly.

In the present embodiment, breakdown in the vicinity of an interface between lower drift layer 81b and each body region 82P (in particular, corner portion CR) is likely to be a determination factor for breakdown voltage of MOSFET 202. Even in such a case, due to substantially the same reason as that in the first embodiment, a sufficient breakdown voltage can be secured while suppressing the on-resistance.

(As to Relation Between Breakdown Voltage and Each of Impurity Concentration $N_A$ and Distance $L_d$)

Figure 24:
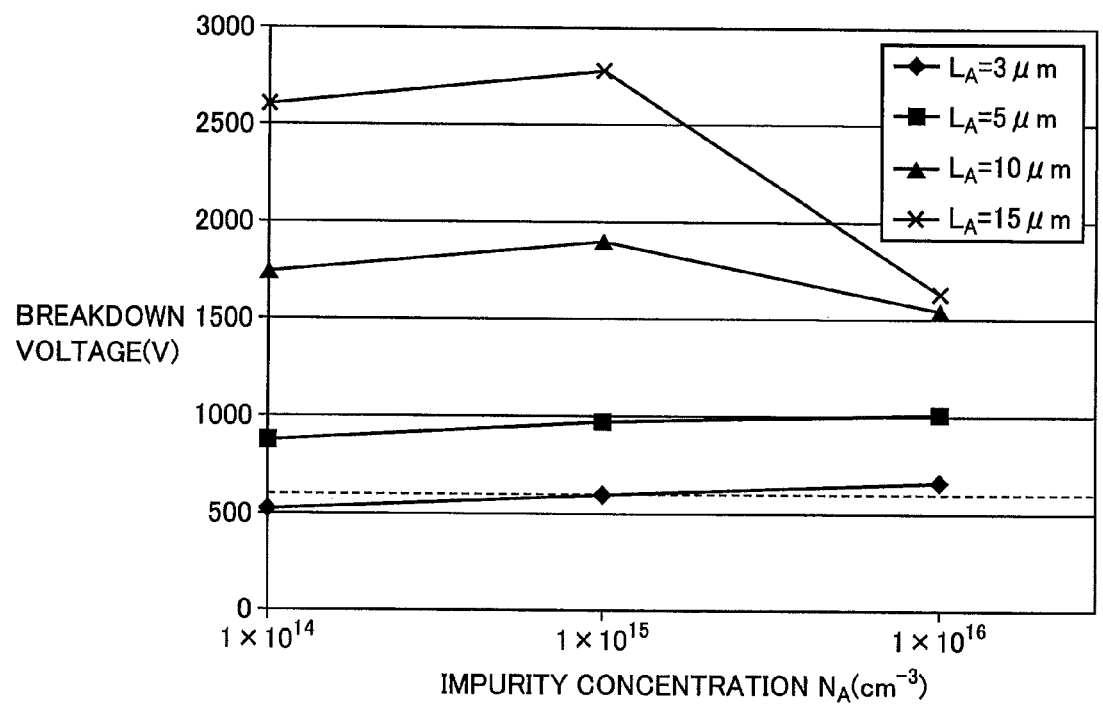
FIG. 24 is a graph illustrating a relation between an impurity concentration $N_A$ of a lower drift layer and a breakdown voltage in each of a case where a distance $L_A$ is 3 μm, a case where distance LA is 5 μm, a case where distance LA is 10 μm, and a case where distance LA is 15 μm.

As shown in a simulation result of FIG. 24, when the impurity dose amount in the relaxation region is sufficiently high to such an extent that relaxation region 71 is not completely depleted, the breakdown voltage of the interface between relaxation region 71 and lower drift layer 81a is mainly determined by impurity concentration $N_A$ of lower drift layer 81a and distance $L_A$ between relaxation region 71 and first surface P1. In a silicon semiconductor device, the upper limit of such a breakdown voltage is approximately 600 V (see the broken line in the figure). In the silicon carbide semiconductor device, when $L_A \geq 5$ μm, a breakdown voltage of not less than 600 V was obtained.

Example 1

For MOSFET 201 (FIG. 1), by changing impurity concentrations $N_A$, $N_B$ and distances $L_A$, $L_B$, simulations 1 to 5 were performed with regard to the electric field strength and on-resistance $R_{ON}$. It should be noted that simulation 1 corresponds to a comparative example in which impurity concentrations $N_A$ and $N_B$ were equal to each other. Results thereof are shown below.

TABLE 1

| # | $N_A$ [cm$^{-3}$] | $L_A$ [μm] | $N_B$ [cm$^{-3}$] | $L_B$ [μm] | Efp/n [MV/cm] | Etrench [MV/cm] | Eox [MV/cm] | Epn [MV/cm] | Ron [mohm·cm$^2$] |
|---|---|---|---|---|---|---|---|---|---|
| 1 | 4.5 × 10$^{15}$ | 9 | 4.5 × 10$^{15}$ | 9 | 2.5 | 1.07 | 3.53 | 0.16 | 9.27 |
| 2 | 4.5 × 10$^{15}$ | 9 | 5.5 × 10$^{15}$ | 3 | 2.5 | 1.12 | 3.73 | 0.16 | 3.25 |
| 3 | 4.5 × 10$^{15}$ | 9 | 7.0 × 10$^{15}$ | 3 | 2.55 | 1.16 | 3.9 | 0.17 | 2.95 |
| 4 | 4.5 × 10$^{15}$ | 9 | 1.0 × 10$^{16}$ | 3 | 2.6 | 1.22 | 4.04 | 0.17 | 2.75 |
| 5 | 4.5 × 10$^{15}$ | 9 | 2.0 × 10$^{16}$ | 3 | 2.7 | 1.5 | 4.4 | 0.18 | 2.50 |

Here, "Efp/n" represents the maximum electric field strength in the vicinity of the interface between relaxation region 71 and lower drift layer 81a. "$E_{trench}$" represents the maximum electric field strength in trench TR. "$E_{OX}$" represents the maximum electric field strength in gate oxide film 91. "Epn" represents the maximum electric field strength in the vicinity of the interface between body region 82 and upper drift layer 81b.

Relaxation regions 71 provided in MOSFET 201 allows for effective suppression of $E_{OX}$, but attention needs to be paid such that Efp/n does not become too high. In simulation 1 (Comparative Example) and simulation 2 (Example), Efp/n was suppressed to approximately the same degree. On the other hand, on-resistance $R_{ON}$ was suppressed more in the latter (Example). As indicated by simulations 3 to 5, by increasing impurity concentration $N_B$, on-resistance $R_{ON}$ is further suppressed.

Example 2

For MOSFET 202 (FIG. 23), simulations similar to those above were performed. Results thereof are shown below.

TABLE 2

| # | $N_A$ [cm$^{-3}$] | $L_A$ [μm] | $N_B$ [cm$^{-3}$] | $L_B$ [μm] | Efp/n [MV/cm] | Epn [MV/cm] | Ron [mohm·cm$^2$] |
|---|---|---|---|---|---|---|---|
| 1 | 4.5 × 10$^{15}$ | 9 | 4.5 × 10$^{15}$ | 9 | 1.67 | 1.28 | 7.66 |
| 2 | 4.5 × 10$^{15}$ | 9 | 7.0 × 10$^{15}$ | 3 | 1.98 | 1.32 | 4.06 |

On resistance $R_{ON}$ in simulation 2 (Example) is suppressed as compared with on-resistance $R_{ON}$ in simulation 1 (Comparative Example).

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims. For example, the trench is not limited to the trench having the flat bottom surface, and may have a U-shaped or V-shaped cross sectional shape.

Further, the silicon carbide semiconductor device is not limited to the MOSFET, and may be an IGBT (Insulated Gate Bipolar Transistor), for example. In this case, the above-described source electrode, source region, and drain electrode respectively have functions as an emitter electrode, an emitter region, and a collector electrode. Moreover, in each of the above-described embodiments, the first conductivity type is n type, and the second conductivity type is p type, but these conductivity types may be replaced with each other. In this case, the donor and the acceptor in the above description are also replaced with each other. It should be noted that in order to attain higher channel mobility, the first conductivity type is preferably n type. Further, the silicon carbide semiconductor device does not need to have the single-crystal substrate, and may have no single-crystal substrate.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
    a first electrode;
    a first drift layer that has a first surface facing said first electrode and electrically connected to said first electrode and a second surface opposite to said first surface, that has first conductivity type, and that has an impurity concentration $N_A$;
    a relaxation region that is provided in a portion of said second surface of said first drift layer, that has a distance $L_A$ from said first surface, and that has second conductivity type;
    a second drift layer that has a third surface in contact with said second surface and a fourth surface opposite to said third surface, and that has said first conductivity type, said first drift layer and said second drift layer forming a drift region in which said relaxation region is buried, said second drift layer having an impurity concentration $N_B$, $N_B > N_A$ being satisfied;
    a body region that is provided on said fourth surface of said second drift layer and that has said second conductivity type;
    a source region that is provided on said body region, that is separated from said drift region by said body region, and that has said first conductivity type;
    a second electrode electrically connected to said source region;
    a gate insulating film including a portion on said body region to connect said source region and said second drift layer to each other; and
    a gate electrode provided on said gate insulating film,
    a trench being provided to have a side wall surface extending into said second drift layer through said source region and said body region and separated from said first drift layer, a gate insulating film being formed to cover the side wall surface and a bottom surface of said trench.

2. The silicon carbide semiconductor device according to claim 1, wherein said third surface has a distance $L_B$ from said fourth surface and $L_A > L_B$ is satisfied.

3. The silicon carbide semiconductor device according to claim 2, wherein $L_A > 2 \cdot L_B$ is satisfied.

4. The silicon carbide semiconductor device according to claim 1, wherein $L_A > 5$ µm is satisfied.

5. The silicon carbide semiconductor device according to claim 1, wherein said relaxation region has a dose amount $D_R$ and $L_A \cdot N_A < D_R$ is satisfied.

6. The silicon carbide semiconductor device according to claim 1, wherein said gate electrode is disposed on said wall surface with said gate insulating film being interposed therebetween.

7. The silicon carbide semiconductor device according to claim 1, wherein a silicon carbide layer including said first drift layer, said relaxation region, said second drift layer, said body region and said source region has an upper surface having a hexagonal shape surrounded by said trench, and said relaxation region has outer edge and opening substantially similar to said upper surface having the hexagonal shape.

8. The silicon carbide semiconductor device according to claim 1, wherein said side wall surface of said trench includes a plane having a plane orientation of {0-33-8}.

9. A silicon carbide semiconductor device comprising:
    a first electrode;
    a first drift layer that has a first surface facing said first electrode and electrically connected to said first electrode and a second surface opposite to said first surface, that has first conductivity type, and that has an impurity concentration $N_A$;
    a relaxation region that is provided in a portion of said second surface of said first drift layer, that has a distance $L_A$ from said first surface, and that has second conductivity type;
    a second drift layer that has a third surface in contact with said second surface and a fourth surface opposite to said third surface, and that has said first conductivity type, said first drift layer and said second drift layer forming a drift region in which said relaxation region is buried, said second drift layer having an impurity concentration $N_B$, $N_B > N_A$ being satisfied;
    a body region that is provided on said fourth surface of said second drift layer and that has said second conductivity type;
    a source region that is provided on said body region, that is separated from said drift region by said body region, and that has said first conductivity type;
    a second electrode electrically connected to said source region;
    a gate insulating film including a portion on said body region to connect said source region and said second drift layer to each other; and
    a gate electrode provided on said gate insulating film,
    a flat surface being provided to have a portion constituted of each of said source region, said body region, and said second drift layer and to be in parallel with said fourth surface of said second drift layer,
    said gate electrode being disposed on said flat surface with said gate insulating film being interposed therebetween.

* * * * *